(12) United States Patent
Maeng et al.

(10) Patent No.: US 6,287,878 B1
(45) Date of Patent: Sep. 11, 2001

(54) METHOD OF FABRICATING CHIP SCALE PACKAGE

(75) Inventors: Ju-seok Maeng, Suwon; In-ho Hyun, Kyungki-do, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/619,987

(22) Filed: Jul. 20, 2000

(30) Foreign Application Priority Data

Jul. 22, 1999 (KR) .................................................. 99-29732

(51) Int. Cl.⁷ ...................................................... H01L 21/66
(52) U.S. Cl. .............................. 438/15; 438/14; 324/755; 324/757; 324/760
(58) Field of Search .................................. 438/14, 15, 16; 324/755, 760, 757

(56) References Cited

U.S. PATENT DOCUMENTS

| 5,475,317 | 12/1995 | Smith | 324/760 |
|---|---|---|---|
| 5,479,105 | 12/1995 | Kim et al. | 324/755 |
| 5,495,179 | 2/1996 | Wood et al. | 324/755 |
| 6,025,732 | * 2/2000 | Foo et al. | 324/760 |
| 6,137,299 | * 10/2000 | Cadieux et al. | 324/757 |
| 6,208,156 | * 3/2001 | Hembree | 324/755 |
| 6,233,184 | * 2/2001 | Barth et al. | 365/201 |
| 6,234,373 | * 5/2001 | Wark | 228/19 |

* cited by examiner

*Primary Examiner*—John F. Niebling
*Assistant Examiner*—Olivia Luk
(74) *Attorney, Agent, or Firm*—Marger Johnson & McCollom, P.C.

(57) ABSTRACT

A chip scale package (CSP) fabricating method is provided. In this method, CSP chips are fabricated on a wafer and subjected to an electric die sorting (EDS) process. Then, CSP chips determined to be non-defective through the FDS process are packaged into a CSP strip. and the CSP strip is subjected to a final test. Then, the CSP strip subjected to the final test is singulated into individual CSPs. Following this, the CSPs are surface-mounted on a module board. Substantially all of the CSPs on the CSP module board are subsequently burn-in tested. As a result, productivity is improved, and manufacturing costs are reduced.

18 Claims, 8 Drawing Sheets

METHOD OF FABRICATING CHIP SCALE PACKAGE

BACKGROUND OF THE INVENTION

1. Field of the Invention

The present invention relates to a method of fabricating a semiconductor package, and more particularly, to a chip scale package (CSP) fabrication method including an electric die sort (EDS) and a burn-in test.

2. Description of the Related Art

Semiconductor packages have been continuously improved to meet new demands for high-performance, small-size and high-speed electronic appliances. Accordingly, semiconductor packages have been evolved from old-fashioned dual in-line packages (DIPs) to state-of-the-art semiconductor packages such as CSPs. As a result, electronic appliances such as camcorders or portable telephones can be miniaturized using the CSPs as their essential components.

The CSPs are known to be ideal for a package having 100 pins or more with high speed operation, or for a package having a large size chip. Although the definition of the CSPs has not been fixed in semiconductor industry, the packages that are smaller than 120% of the size of a semiconductor chip is typically referred to as a CSP. Even semiconductor packages larger than 120% of the size of a chip, such as ball grid array (BGA) packages, land grid array (LGA) packages, and small outline non-leaded (SON) packages, are considered as a CSP. In particular, the BGA packages having solder balls instead of leads mounted on the lower surface thereof, the LGA packages having a land array mounted on the lower surface thereof, and the SON packages having two land arrays instead of leads mounted on the lower surface thereof are examples of the CSPs.

FIG. 1 is a flowchart illustrating a typical process for fabricating CSPs. Referring to FIG. 1, a plurality of semiconductor chips are formed on a wafer by integrated circuit fabricating processes. Then, the plurality of chips on the wafer are tested to identify good dies from bad dies depending on electrical characteristics or functionality of each chip by performing an electric die sorting (EDS) process. The EDS process utilizes a probe card having probe needles mounted thereon for electrically connecting a tester to an individual chip for testing, in step 51. Following the EDS process, preferably, only good dies are packaged into a CSP strip, in step 53. Next, the CSP strip is singulated (separated) into individual CSPs, in step 55.

The individual CSPs are subjected to a burn-in test for inducing the failure of marginal CSPs with defects, in step 57. This burn-in test accelerates failure mechanisms such that devices which have the potential to fail later but which failure would not otherwise be apparent at nominal test conditions can be eliminated by applying a serious stress, for example, heat, voltage or high frequency such as a clock, to a semiconductor package. Thus, defective CSPs can be screened out early before a final test, and only non-defective CSPs are subjected to the final test, in step 59.

Next, the final test is preformed, in step 59, on CSPs that are determined to be good (non-defective) in the burn-in test. Then, CSPs determined to be good (fully-funictional) by the final test are marked their corresponding product titles, in step 61. Also, in step 61, the CSPs are finally inspected for visual defects. Thereafter, good CSPs are surface-mounted on a module board, in step 63. The CSP module is subjected to a module test, in step 65, and finally packed to be sent to end users, in step 67. Here, reference numeral 69 denotes a section where process steps are being carried out with singulated CSPs, before module assembly. Reference numeral 71 denotes a section from module assembly to final packing, where process steps are being carried out with a CSP module board.

FIG. 2 is a schematic view illustrating a final test using a plastic tray 93 that is generally used to transport CSPs. Referring to FIG. 2, singulated CSPs are placed on the plastic tray 93 and then are transported between the processes using the tray 93. Thus, in the final test, singulated CSPs are contained on the test tray 93. The test tray 93 has a plastic main body 89 whose surface is treated as anti-static, and grooved pockets 91 on which singulated individual CSPs 81 are placed. Thereafter, the singulated CSPs placed on the test tray 93 are loaded onto a handler connected to a tester. In the handler, solder balls acting as external connection terminals for CSPs 81 are connected to socket contact terminals 87 (e.g., POGO pins) in a socket 85 on an interface board 83, and the CSP 81 is subjected to the final test. Although not shown, in burn-in test equipment, CSPs are inserted into sockets on a burn-in board, and subjected to a reliability test to sort out defective CSPs early.

According to this conventional CSP fabrication method, singulated individual CSPs are loaded on a plastic tray and unloaded from a burn-in board numerous times during a burn-in-test. Also, in a final test, loading and unloading to and from the plastic tray are repeated.

Hence, the final test and the burn-in test with respect to singulated individual CSPs have the following problems.

First, as external connection terminals, CSPs generally use solder balls, rather than outer leads. Such solder balls could be easily damaged by outside impact or physical stress. Further, encapsulating materials for the CSPs are relatively weaker than that of conventional encapsulating materials for ceramic or plastic packages. Thus, generally the CSPs are vulnerable against physical impact during the repeated loading and unloading in the burn-in test and the final test. Accordingly, various visual defects can occur easily. The visual defects include package breaking, cracking, damage to solder balls, and consequential contact failure. These visual defects significantly reduce the yield of the CSP fabrication process.

Second, the CSPs being a surface-mounting semiconductor package have more contact terminals than the other conventional semiconductor packages. Thus contact failure in the CSPs is more and more frequent due to an increase in the number of contact terminals during the burn-in test and the final test.

Third, a complicated mechanism is needed to connect the socket to solder balls of the CSPs. This inevitably increases the price of socket, in tun, increasing overall manufacturing costs.

Fourth, the burn-in testing process and the final test require a great amount of time and man-power for repeated loading and unloading. Accordingly, an excessive amount of time and man-power is required in the conventional CSP fabrication process, thus lowering productivity.

Accordingly, what is needed is a better way to fabricate the CSPs minimizing the visual defects, contact failure and the other problems discussed above, thereby improving productivity and lowering manufacturing costs.

SUMMARY OF THE INVENTION

The above-mentioned problems with fabricating CSPs are addressed by the present invention and which will be understood by reading and studying the followings specification.

In the present invention chip scale package (CSP) fabrication method, CSPs are assembled into a CSP strip. Then, the CSP strip is directly subjected to a final electrical test without performing a CSP strip singulation process. Accordingly, a burn-in test is performed on the CSP strip (module board) rather than on an singulated individual CSPs, so that the external impact applied to CSPs can be minimized and the probability in which contact failure occurs is reduced. Further productivity is improved by saving time and man-power required for loading and unloading, and the manufacturing costs can be reduced by avoiding use of an expensive socket for singulated CSPs.

Another feature of the present invention is that a final test process is performed on a CSP strip in the CSP fabrication process.

Still another feature of the present invention is to provide a CSP burn-in testing method for burn-in testing CSPs assembled on a module board.

To achieve the first feature, the present invention provides a chip scale package (CSP) fabrication method including: (a) fabricating CSP chips on a wafer; (b) performing an electric die sorting (EDS) process on the CSP chips on the wafer; (c) packaging CSP chips determined to be non-defective through the EDS process, into a CSP strip; (d) performing a final test to the CSP strip; (e) singulating the CSP strip subjected to the final test into CSPs; (f) surface-mounting the CSPs on a module board; and (g) burn-in testing all of the CSPs on the CSP module board.

Preferably, the CSP in the step (a) is a wafer-level CSP, a ball grid array (BGA) CSP, or a land grid array (LGA) CSP, and the CSP chips in the step (a) are semiconductor memory chips.

It is also preferable that the CSP strip in the step (c) is fabricated by assembling $2^n$ CSPs (where n is a natural number), and that the final test in the step (d) uses a pressure conductive rubber (PCR) as the contactor of a tester which is connected to an external connection terminal of a CSP.

Preferably, the steps of marking the CSP strip and performing visual inspection of the CSP strip are further included after the step (d).

Also, in the burn-in test in the step (g), an electrical test is performed simultaneously while a CSP module board is mounted on a burn-in board and stress for burn-in test is being applied to the CSP module board. Alternatively, in the burn-in test in the step (g), a CSP module board is loaded on a burn-in board, and stress is applied to the CSP module board, and then CSP modules are unloaded from the burn-in board and electrically tested.

It is also preferable that a final module test, including measurement of the function and speed of each of the CSP modules, and visual inspection with respect to CSP modules are further performed after the burn-in test step (g).

To achieve the second feature, there is provided a final test with respect to a chip scale package (CSP) strip, including: (a) packaging non-detective chips on a wafer, which are determined to be non-defective through EDS, into the form of a CSP strip; (b) connecting the CSP strip to the contactor of a tester; and (c) performing a final test to the contacted CSP strip.

Preferably, the CSP strip in the step (a) is fabricated by assembling $2^n$ CSPs (where n is a natural number), and the tester contactor in the step (b) is a pressure conductive rubber (PCR).

To achieve the third feature, there is provided a CSP burn-in testing method including: (a) surface-mounting at least one CSP on a module board; (b) loading the module board on a burn-in board; and (c) burn-in testing the loaded module board.

Preferably, in the burn-in testing step (c), an electrical test is performed simultaneously while stress for burn-in testing is being applied to the CSP module board. Alternatively, in the burn-in testing step (c), stress for burn-in testing is applied to the CSP module board, and then CSP module boards are unloaded from the burn-in board and electrically tested.

According to the present invention, a final test and a burn-in test process are respectively performed on a CSP strip and a CSP module board instead of individual CSPs, thus improving the productivity of a CSP fabrication process, reducing the manufacturing costs of CSPs, and increasing the yield of CSPs.

BRIEF DESCRIPTION OF THE DRAWINGS

The above features and advantages of the present invention will become more apparent by describing in detail a preferred embodiment thereof with reference to the attached drawings in which.

DESCRIPTION OF THE PREFERRED EMBODIMENT

By way of example, a pressure conductive rubber (PCR) is used as a contactor to electrically test a chip scale package (CSP) to describe the present invention. However, the present invention can be performed in a different way without departing from its essential features. For example, the PCR used in the present invention can be replaced by a POGO pin type contactor, a partial interconnection (PI) type contactor, and a spring contact type contactor. Also, a CSP module is formed with 8 CSPs being aligned on a module board, but can be formed in other ways. Therefore, while numerous specific details are set forth in order to provide a thorough understanding of the present invention, it will be understood, however, to one skilled in the art, that the present invention may be practiced without some or all of these specific details.

CSP FABRICATION METHOD

Figure 1:
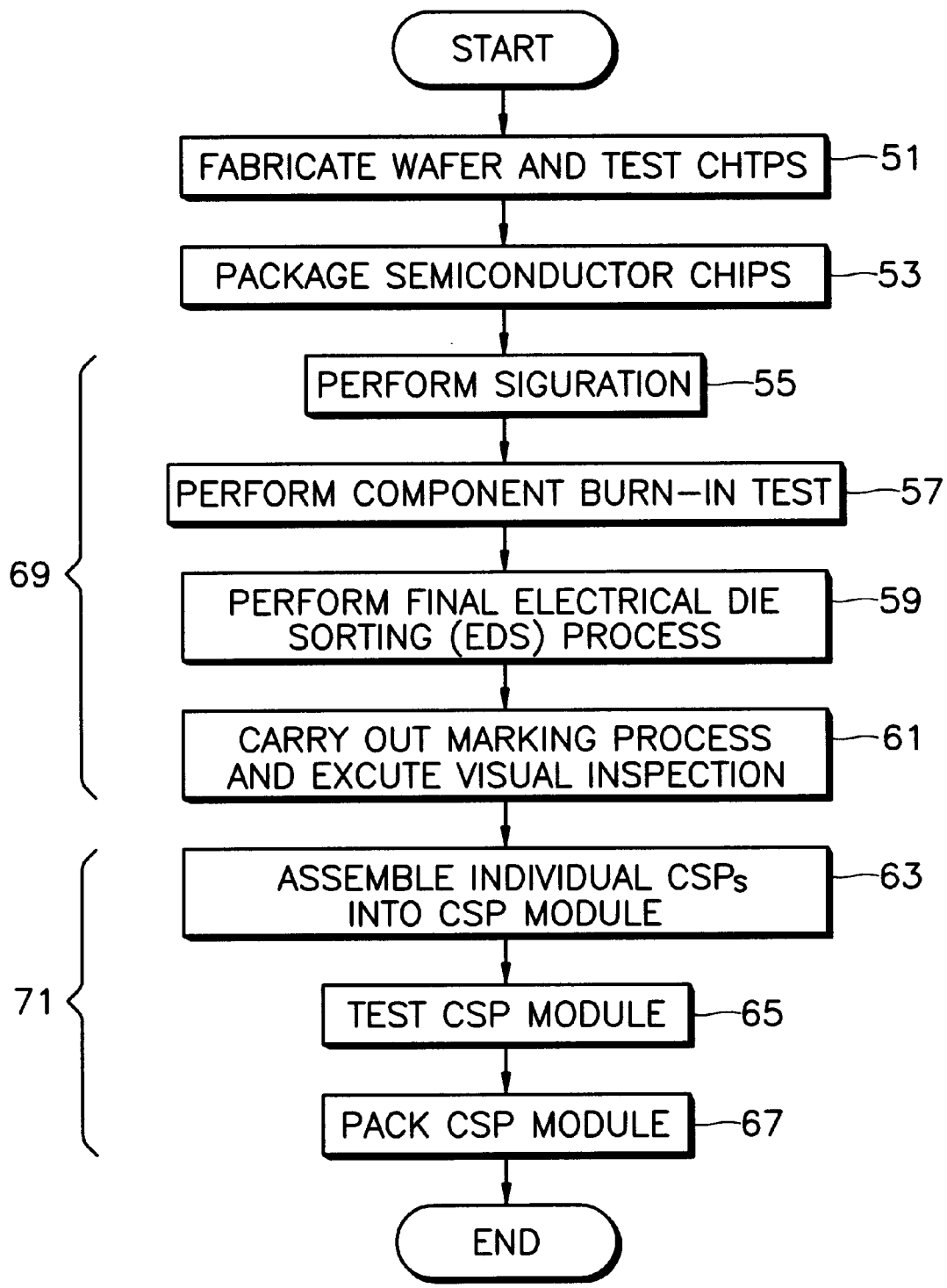
FIG. 1 is a flowchart illustrating a conventional chip scale package (CSP) fabrication method.
Figure 2:
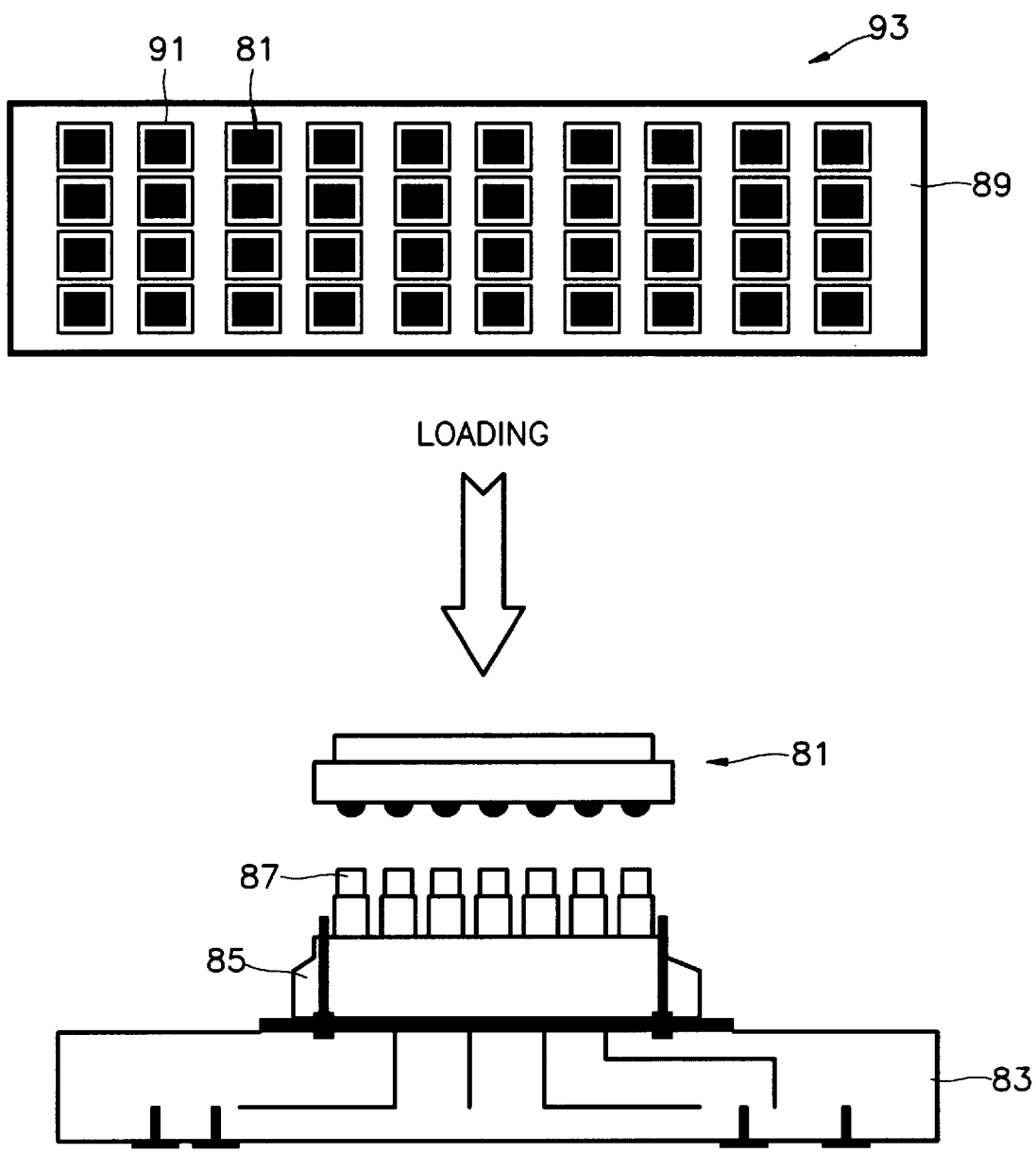
FIG. 2 is a schematic view illustrating a conventional testing plastic tray which is used in a final test and a CSP burn-in test.
Figure 3:
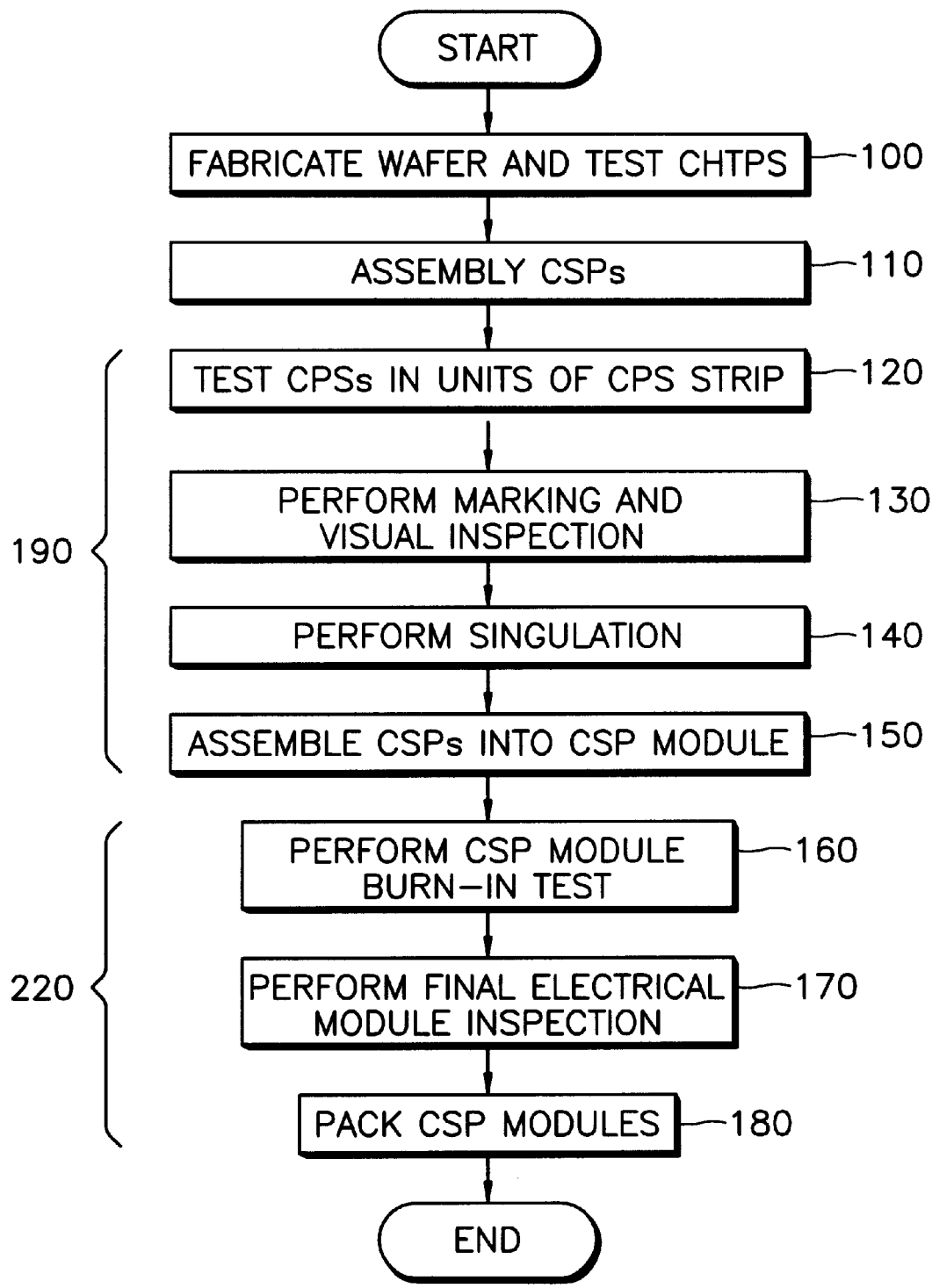
FIG. 3 is a flowchart illustrating a CSP fabrication method according to the present invention.

FIG. 3 is a flowchart illustrating a CSP fabrication method according to the present invention. Referring to FIG. 3, a plurality of semiconductor chips are formed on a wafer by integrated circuit fabrication processes. Then, an electric die sorting (EDS) process using probe needles (tips) is performed on the plurality of chips to screen out bad chips with failing electrical characteristics, in step 100.

Following the EDS process, a conventional CSP packaging process is performed using processes such as wafer sawing, die bonding, wire bonding, encapsulation, and mounting and attaching of solder balls or solder bumps, in step 110. In the case of wafer-level CSPs, however, wire bonding, encapsulation, and solder ball mounting processes can be omitted, because bumps are previously formed on bond pads during wafer processing. Instead, a die bonding process for attaching chips to a strip-type carrier is required.

According to the present invention, before a final test, a CSP strip with a plurality of CSPs formed thereon ("CSP strip") is not singulated into a plurality of individual CSPs so that the CSPs are left in a strip form unlike the conventional process. Here, the number of CSPs formed on a strip is $2^n$ (n is a natural number). For example, thus, 32 CSPs or 64 CSPs can be formed on a single strip. The 32 CSPs or 64 CSPs allows parallel testing to be performed in a subsequent final test. The process sequence of packaging the CSPs is not important in the present invention, so will not be described in detail.

Importantly, for the purpose of the present invention, CSPs should be transported and handled in strip form between predetermined processes without being singulated even after solder balls are attached in a reflowing process, contrast to a conventional CSP fabrication method. That is, in a conventional CSP fabrication process, individual CSPs are transported as singulated between processes on a plastic tray, and thus must be repeatedly loaded and unloaded individually by the handler of a tester, one by one. However, in the present invention, CSPs are transported on a strip without being singulated from a strip between the predetermined processes. Thus, in the present invention, the CSPs are electrically tested in groups of a CSP strip rather than in groups of individual singulated CSPs, in step 120. Thus, in the present invention, the loading and unloading of individual singulated CSPs for burn-in or testing, which has been conventionally required, are not required. As a result, an expensive socket is not required, either. Also, with this aspect of the present invention, damage to CSPs can be prevented by the external physical impact. This reduces visual defects during the CSP fabrication process. Thus yield can be improved significantly.

In the present invention, a pressure conductive ribber (PCR) can be used for connecting the CSP strip to the tester. The PCR becomes vertically conductive upon the pressure from protruding solder balls or bumps, which are external connection means of CSPs. Accordingly, CSPs can be connected to an interface board of the tester without electrical shorts or open problems.

Then, a marking process for marking the title of a product on the surface of the body of the CSPs is performed, and visual inspection is performed to detect visual defects from the CSP strip, in step 130. Thereafter, singulation is lastly performed to separate the CSP strip into individual CSPs, in step 140. At this time, CSPs determined to be defective in the final test 120 are also singulated and then discarded depending on the results of the test stored in testing equipment.

Following this, individual CSPs are surface-mounted on a module board, forming CSP module boards, in step 150. Then, in a burn-in system, the CSP module boards are inserted into each socket mounted on a burn-in board. Thereafter, a burn-in test is performed by applying stress to the CSP module board in step 160. The burn-in test includes a dynamic burn-in test and a static burn-in test depending on the types of stress applied. The present invention can be applicable to both types of burn-in tests. Also, during the burn-in test process, an electrical test can be simultaneously performed while stress is being applied. Alternatively, after stress is applied to the burn-in board, the CSP module boards are removed from the burn-in board, so that an electrical test can be independently performed on the removed CSP module boards.

Thus, in the present invention, an entire CSP module board is placed in a socket and burned-in, while, in the prior art, singulated CSPs are each placed in a socket and individually burned-in. That is, the present invention uses a burn-in board having sockets into which module boards are each inserted, instead of a burn-in board having sockets into which individual singulated CSPs are each inserted as in prior art. Thus, without having to load or unload individual CSPs into or from burn-in sockets, one by one, CSPs can be inserted into sockets on a burn-in board in groups of a module board having a plurality of CSPs formed thereon.

Such a burn-in test 160 performed in groups of a module board has various advantages as compared to a conventional burn-in test system where individual singulated CSPs are inserted into the sockets of a burn-in board, one by one. That is, for example, the time for loading and unloading can be saved. Expensive CSP sockets are not required. The area of a burn-in board is efficiently used, thereby increasing the number of CSPs that can be burned-in on a burn-in board. External physical impact that may be applied to CSPs in the loading and unloading step can be prevented, thus suppressing occurrence of visual defects. Also, a potential contact failure, which can occur during the connecting of individual CSPs to sockets, can be reduced. This can prevent occurrence of a burnt defect, i.e., CSPs being deteriorated on a burn-in board while stress is being applied. Furthermore, the burn-in test in groups of a module board is more reliable in practical applications, compared to an existing burn-in test in groups of individual CSPs, because CSPs are generally used in the form of a module by endusers, especially when the CSPs are for memory devices.

Next, an electrical test, a post burn-in step, is performed on the CSP module boards subjected to the module burn-in test 160, in step 170. Then, the CSP module boards are subjected to a final visual inspection (not shown), and are packed and sent to users, in step 180.

Here, reference numeral 190 denotes a section where CSPs are transported in a strip form between predetermined processes, and reference numeral 200 denotes a section where CSPs are transported in a module board between predetermined processes.

FINAL TEST ON CSPS

The structure of a CSP strip which is used in the above-described CSP fabrication process, and a final test on the CSP strip will now be described with reference to FIGS. 4 through 8.

Figure 4:
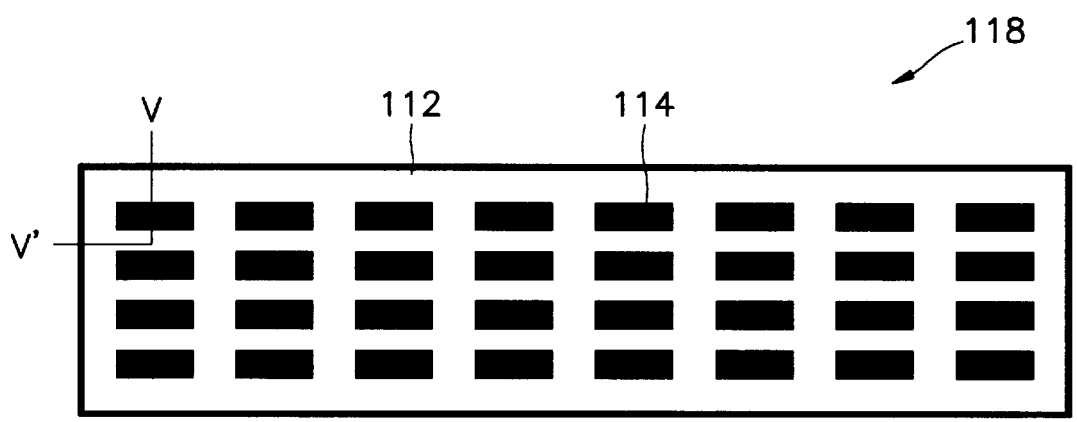
FIG. 4 is a plan view of a CSP strip according to the present invention.

FIG. 4 is a plan view of a CSP strip according to the present invention. Referring to FIG. 4, a CSP strip 118 is formed by mounting a plurality of CSPs 114 on a printed circuit board (PCB) or a strip substrate 112 formed of a material such as a polyimide, solder resist, and epoxy tape. In FIG. 4, 32 CSPs are mounted for performing a parallel final test with ease. However, different numbers of CSPs can be used other than 32 CSPs as long as the number of CSPs are suitable for a parallel final test.

Figure 5:
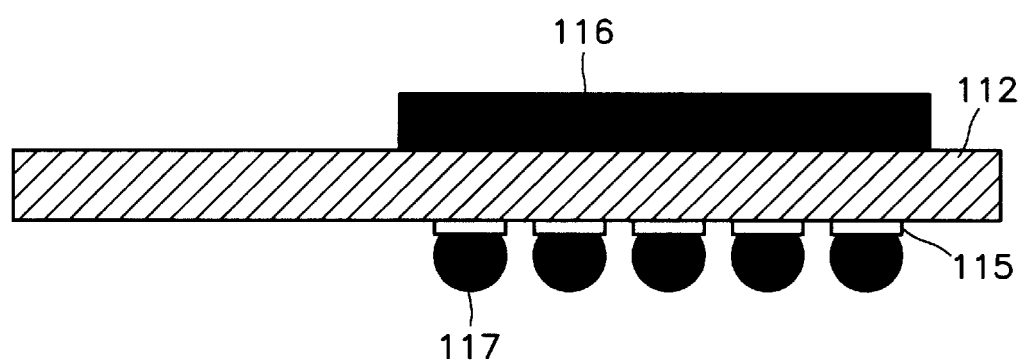
FIG. 5 is a cross-sectional view taken along line V–V' of FIG. 4.

FIG. 5 is a cross-sectional view taken along line V–V' of FIG. 4. Referring to FIG. 5, a CSP body 116 is formed on the upper surface of the strip substrate 112, and solder balls 117, which are external connection terminals, are attached to the lower surface of the strip substrate 112 via metal pads 115 and protrude therefrom.

Figure 6:
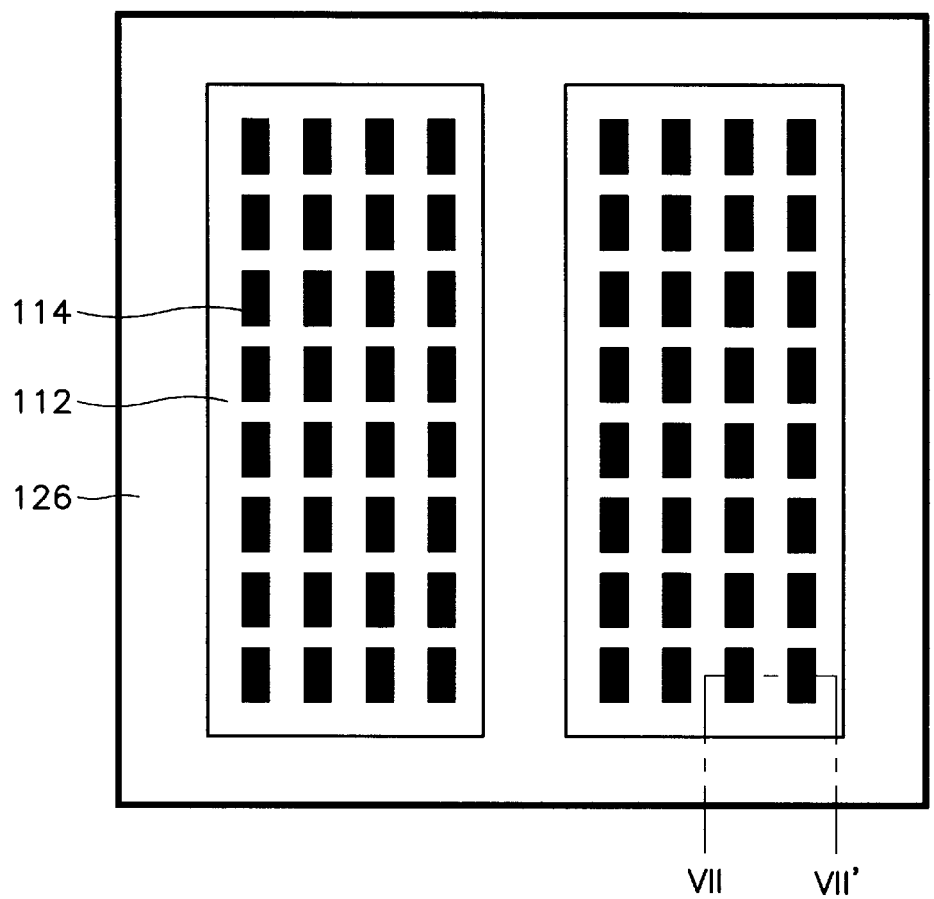
FIG. 6 is a plan view of a CSP strip according to the present invention to explain an electrical test process with respect to the CSP strip.

FIG. 6 is a plan view of a CSP strip according to the present invention to illustrate a process in which the CSP strip is electrically tested. Referring to FIG. 6, solder balls formed on the bottom surface of the strip substrate 112 are pressed to a PCR of a stage for performing an EDS process, for example, a probe stage 126. First, the solder balls of the CSP 114 and the PCR of the probe stage 126 are aligned accurately to be connected to each other. Then, the CSP strip is pressed to contact the PCR on the probe stage 126 by suction using vacuum.

Figure 7:
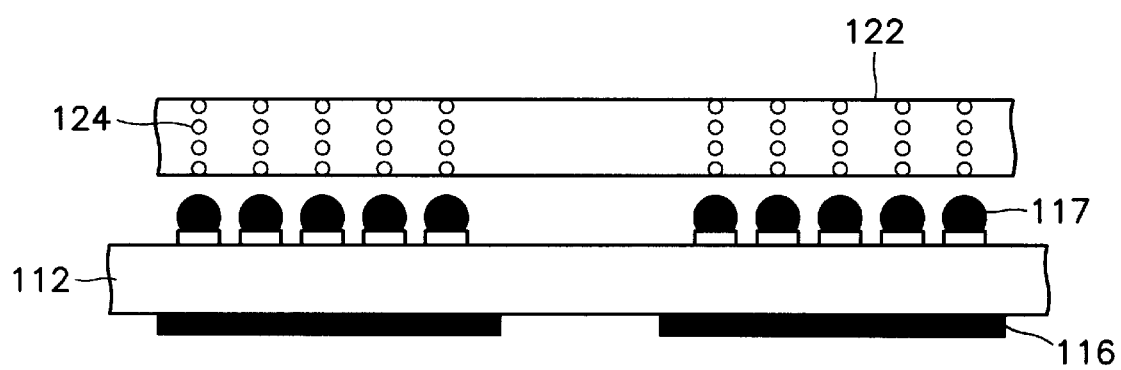
FIG. 7 is a cross-sectional view of an individual CSP of FIG. 6 which contacts a contactor of a tester.

FIG. 7 is a cross-sectional view of the CSPs of FIG. 6, which contact the contactor of a tester. Referring to FIG. 7, showing a cross-section taken along line VII–VII' of FIG. 6, protruding solder balls 117, which are attached to one surface of the strip substrate 112, are pressed to a PCR, a strip contactor 122 of a tester, with an appropriate pressure. Then, conductive grains 124 within the PCR 122 are pressed together with rubber so that the solder balls 117 and the PCR 12 are electrically connected to each other substantially only a vertical direction. Here, reference numeral 116 denotes the body of CSPs.

Figure 8:
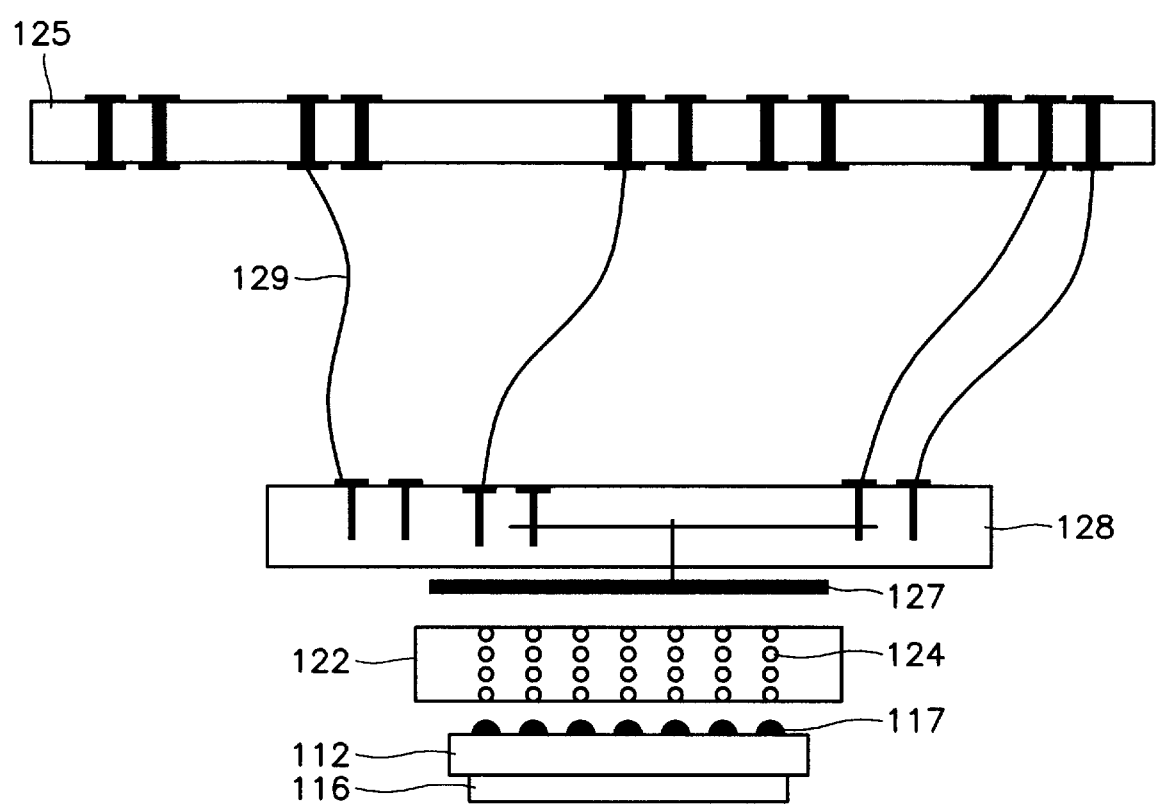
FIG. 8 is a schematic cross-sectional view of an individual CSP on a CSP strip according to the present invention, which is connected to a tester.

FIG. 8 is a schematic cross-sectional view of a CSP on a CSP strip connected to a tester in accordance with the present invention. Referring to FIG. 8, the solder balls 117 of the CSP package are electrically connected to the strip contactor PCR 122 as illustrated in FIG. 7. Signals transmitted from the solder balls 117 to the strip contactor PCR 122 are electrically connected to an interface board 128 via an interface board connection unit 127, and signals from the interface board 128 are continuously electrically connected to a universal board 125 which is the test head of the tester, through coaxial cables 129. This way, a final test is carried out through transmission and reception of signals.

CSP BURN-IN TEST

A CSP fabrication method according to the present invention will now be described in detail with reference to FIGS. 9 through 11.

Figure 9:
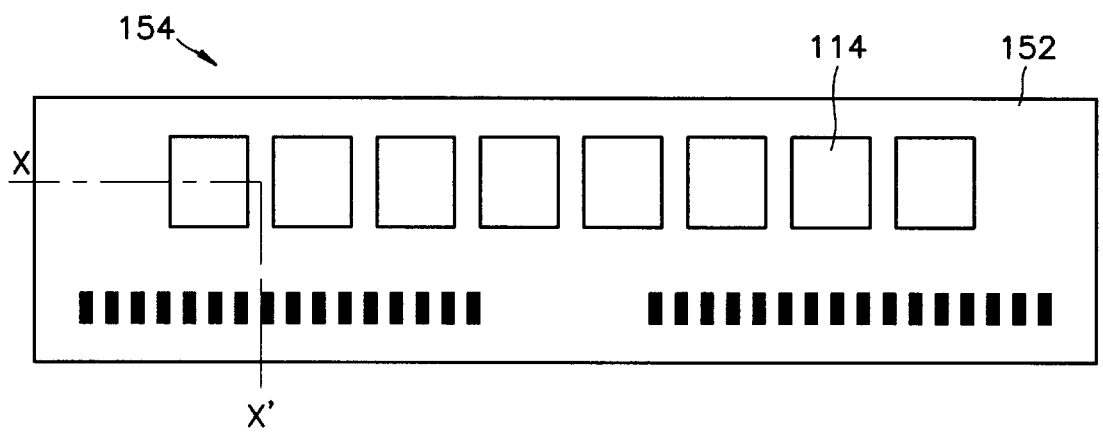
FIG. 9 is a plan view of individual CSPs according to the present invention which are surface-mounted on a module board.

FIG. 9 is a plan view of CSPs surface-mounted on a module board according to the present invention. Referring to FIG. 9, a module board 154 is formed by surface-mounting 8 CSPs 114 to a PCB or a module board substrate 152 made of a material Such as polyimide.

Figure 10:
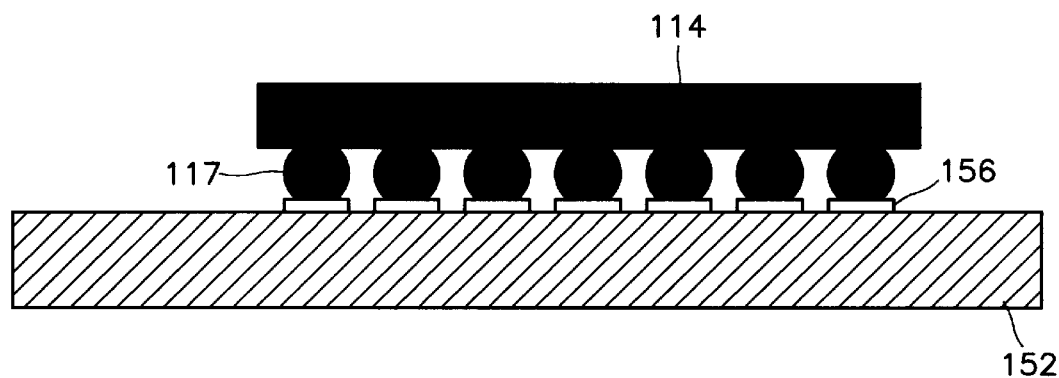
FIG. 10 is a cross-sectional view taken along line X–X' of FIG. 9.

FIG. 10 is a cross-sectional view taken along line X–X' of FIG. 9. Referring to FIG. 10, metal pads 156 of the module board formed on one surface of the module board substrate 152 are coated with flux, and solder balls 117 of CSP 114 are attached to the metal pads 156 of the module board by solder reflow.

Figure 11:
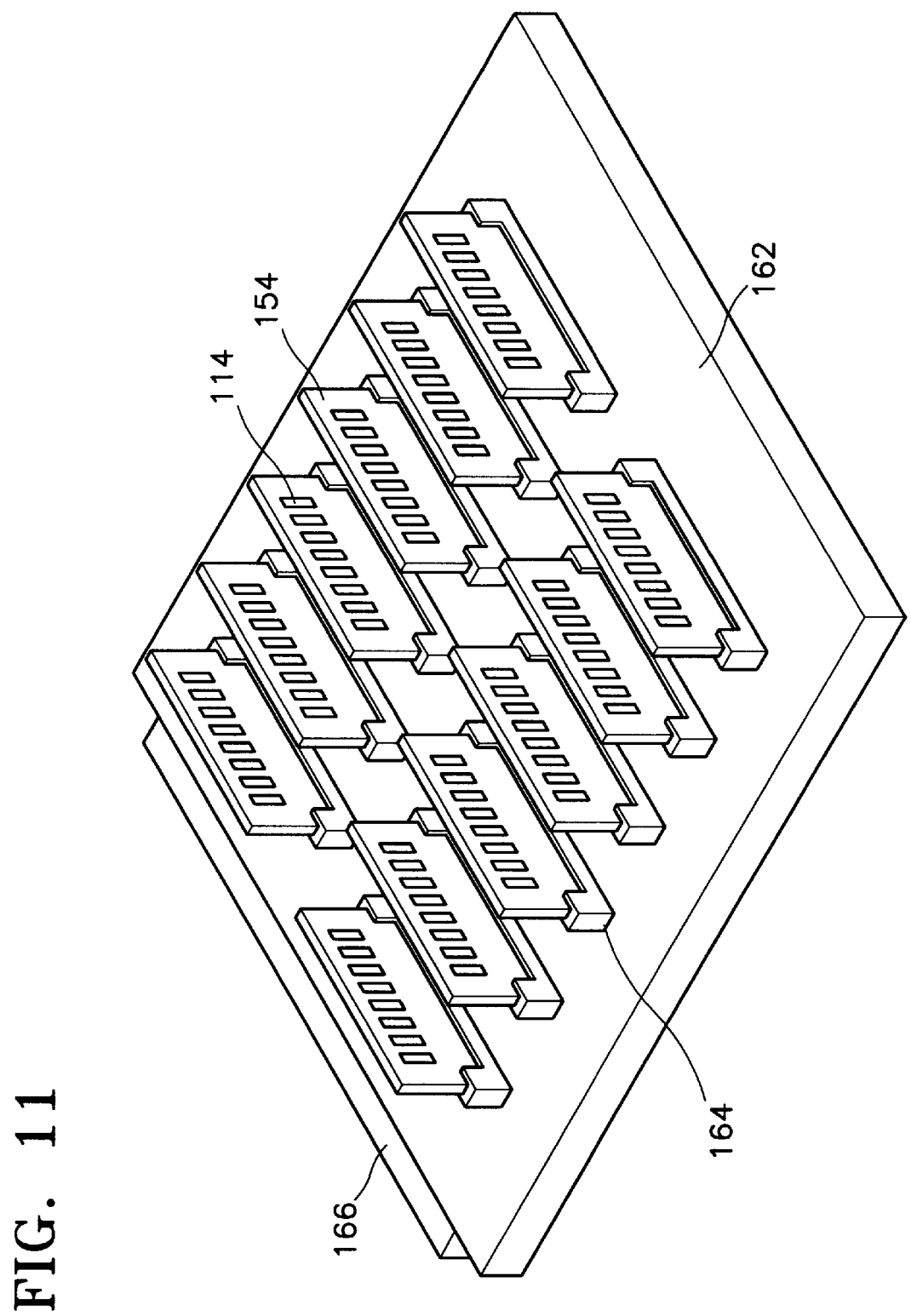
FIG. 11 is a perspective view of a burn-in board on which CSP modules according to the present invention are mounted.

FIG. 11 is a perspective view of a burn-in board on which CSP module boards are mounted in accordance with the present invention. Referring to FIG. 11, the CSP module boards 154 shown in FIG. 9 are inserted into module insertion sockets 164 installed on a burn-in board substrate 162. Here, reference numeral 166 denotes a burn-in board connector for connecting a burn-in board to a burn-in system.

According to the present invention, a final test is performed on CSPs in groups of a CSP strip instead of in groups of singulated individual CSPs, and a burn-in test is conducted on CSPs in groups of a CSP module board instead of in groups of individual singulated CSPs. Accordingly, a CSP fabrication process according to the present invention has the following merits.

First, time and man-power can be saved by skipping loading/unloading steps during burn-in and final test, thus preventing visual defects from being generated by damage to CSPs, which is frequently caused by physical impact during the loading/unloading steps. Therefore, the productivity and yield of the total manufacture process can be improved.

Second, a final test and a burn-in process do not require expensive sockets, thus lowering the manufacturing costs. A contact failure which occurs in sockets can be prevented, thus improving the yield.

Third, a burn-in board can perform a burn-in test on a larger number of CSPs per unit area. That is, the burn-in test can be preformed by changing only a burn-in board without reconstructing an existing burn-in system, so that the operation ratio of equipment is increased. Therefore, productivity can be improved.

Fourth, a burn-in test performed on CSPs in groups of a CSP module board is more reliable in practical use, compared to a burn-in test performed on CSPs in groups of individual CSPs, since CSPs in the form of a module are generally used by users when the CSPs is for a memory device.

Although the invention has been described with reference to a particular embodiment, it will be apparent to one of ordinary skill in the art that modifications of the described embodiment may be made without departing from the spirit and scope of the invention.

What is claimed is:

1. A chip scale package (CSP) fabrication method, comprising:
   (a) fabricating CSP chips on a wafer;
   (b) performing an electric die sorting (EDS) process on the CSP chips on the wafer to identify non-defective chips;
   (c) packaging the non-defective chips onto a strip substrate, thereby forming a CSP strip;
   (d) performing a final test on the CSP strip;
   (e) singulating the CSP strip into individual CSPs;
   (f) surface-mounting the CSPs on a module board; and
   (g) burn-in testing the CSPs on the module board.

2. The CSP fabricating method of claim 1, wherein the CSP in the step (a) is a wafer-level CSP, a ball grid array (BGA) CSP, or a land grid array (LGA) CSP.

3. The CSP fabricating method of claim 1, wherein the CSP chips in the step (a) are semiconductor memory chips.

4. The CSP fabricating method of claim 1, wherein the CSP strip in the step (c) is fabricated by assembling $2^n$ CSPs (where n is a natural number).

5. The CSP fabricating method of claim 1, wherein the final test in the step (d) uses a pressure conductive rubber (PCR), as the contactor of a tester, being connected to an external connection terminal of a CSP.

6. The CSP fabricating method of claim 1, further comprising marking the CSP strip, after the step (d).

7. The CSP fabricating method of claim 6, after the marking step, which further comprises performing visual inspection of the CSP strip.

8. The CSP fabricating method of claim 1, wherein in the burn-in test in the step (g), an electrical test is performed concurrently while a CSP module board is mounted on a burn-in board and stress for burn-in test is applied to the CSP module board.

9. The CSP fabricating method of claim 1, wherein in the burn-in test step (g), a CSP module board is loaded on a burn-in board, and stress is applied to the CSP module board, and then CSP modules are unloaded from the burn-in board and electrically tested.

10. The CSP fabricating method of claim 1, after the burn-in test step (g), which further comprises performing a final module test including measurement of the function and speed of each of the CSP modules.

11. The CSP fabricating method of claim 10, after the final module test, which further comprises visual inspection of the CSP modules.

12. A method of performing a final test on a chip scale package (CSP) strip, comprising:
 (a) packaging a plurality of chips on a wafer into a form of a CSP strip, wherein at least one of the plurality of chips are determined to be non-defective through EDS;
 (b) connecting the CSP strip to the contactor of a tester; and
 (c) performing a final electrical test to the connected CSP strip.

13. The final test with respect to a CSP strip of claim 12, wherein the CSP strip in the step (a) is fabricated by assembling $2^n$ CSPs (where n is a natural number).

14. The final test with respect to a CSP strip of claim 12, wherein the tester contactor in the step (b) is a pressure conductive rubber (PCR).

15. A CSP burn-in testing method, comprising:
 (a) surface-mounting at least one CSP on a module board;
 (b) loading the module board on a burn-in board; and
 (c) burn-in testing the loaded module board.

16. The CSP burn-in testing method of claim 15, wherein in the burn-in testing step (c), an electrical test is performed concurrently while stress for burn-in testing is being applied to the CSP module board.

17. The CSP burn-in testing method of claim 15, wherein in the burn-in test step (c), stress for burn-in testing is applied to the CSP module board, and then CSP module boards are unloaded from the burn-in board and electrically tested.

18. A chip scale package (CSP) fabrication method, comprising:
 (a) fabricating a CSP strip, which comprises a plurality of CSPs formed on a strip substrate;
 (b) performing a final test on the CSP strip;
 (c) singulating the CSP strip into individual CSPs;
 (d) surface-mounting the individual CSPs on a module board; and
 (e) burn-in testing substantially all of the CSPs on the module board.

* * * * *

UNITED STATES PATENT AND TRADEMARK OFFICE
CERTIFICATE OF CORRECTION

PATENT NO. : 6,287,878 B1
DATED : September 11, 2001
INVENTOR(S) : Maeng et al.

It is certified that error appears in the above-identified patent and that said Letters Patent is hereby corrected as shown below:

<u>Title page,</u>
ABSTRACT, "FDS" should read -- EDS -- and "strip. and" should read -- strip, and --.

<u>Column 2,</u>
Line 51, "tun" should read -- turn --.
Line 66, "followings specification" should read -- following specifications --.

<u>Column 3,</u>
Line 6, "on an singulated" should read -- on singulated --.
Line 57, "non-detective" should read -- non-detective --.

<u>Column 5,</u>
Line 56, "ribber" should read -- rubber --.

Signed and Sealed this

Nineteenth Day of March, 2002

JAMES E. ROGAN
*Director of the United States Patent and Trademark Office*

*Attest:*

*Attesting Officer*